United States Patent
Kuczynski et al.

(10) Patent No.: US 9,601,451 B2
(45) Date of Patent: Mar. 21, 2017

(54) APPARATUS AND METHODS FOR CREATING ENVIRONMENTALLY PROTECTIVE COATING FOR INTEGRATED CIRCUIT ASSEMBLIES

(71) Applicant: LENOVO ENTERPRISE SOLUTIONS (SINGAPORE) PTE. LTD., Singapore (SG)

(72) Inventors: Joseph Kuczynski, North Port, FL (US); Melissa K. Miller, Morrisville, NC (US); Heidi D. Williams, Cary, NC (US); Jing Zhang, Poughkeepsie, NY (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/823,021

(22) Filed: Aug. 11, 2015

(65) Prior Publication Data
US 2017/0047304 A1    Feb. 16, 2017

(51) Int. Cl.
| | |
|---|---|
| *H01L 23/48* | (2006.01) |
| *H01L 23/00* | (2006.01) |
| *B23K 1/00* | (2006.01) |
| *H05K 3/34* | (2006.01) |

(Continued)

(52) U.S. Cl.
CPC ............ *H01L 24/17* (2013.01); *B23K 1/0016* (2013.01); *H01L 23/3142* (2013.01); *H01L 23/49838* (2013.01); *H01L 24/11* (2013.01); *H01L 24/81* (2013.01); *H05K 3/341* (2013.01); *H01L 2224/11011* (2013.01); *H01L 2224/16055* (2013.01); *H01L 2224/16057* (2013.01); *H01L 2224/16227* (2013.01); *H01L 2224/81007* (2013.01); *H01L 2224/81815* (2013.01); *H01L 2924/06* (2013.01); *H01L 2924/14* (2013.01); *H01L 2924/1531* (2013.01)

(58) Field of Classification Search
CPC ......... H01L 24/17; H01L 24/11; H01L 24/81; H01L 23/3142; H01L 23/39838; H01L 21/563; B23K 1/0016; H05K 3/341
USPC ....................................................... 257/738
See application file for complete search history.

(56) References Cited

U.S. PATENT DOCUMENTS

| | | |
|---|---|---|
| 5,299,730 A | 4/1994 | Pasch et al. |
| 5,821,624 A | 10/1998 | Pasch |

(Continued)

FOREIGN PATENT DOCUMENTS

JP    10135247 A    5/1998

OTHER PUBLICATIONS

Wettermann, "PCB Repair/Rework & BGA Reballing Kit", soldertools.net (online), Jan. 12, 2015, 16 pages, URL: pcbrework.wordpress.com.

(Continued)

*Primary Examiner* — Tu-Tu Ho
(74) *Attorney, Agent, or Firm* — Brandon C. Kennedy; Douglas W. Robinson; Kennedy Lenart Spraggins LLP

(57) ABSTRACT

Example methods, apparatus, and products for creating an environmentally protective coating for integrated circuit assemblies are described herein. A preform plastic sheet is places over components of an integrated circuit such that during a reflow process, the preform plastic sheet melts to form a conformal coating over components of the integrated circuit assembly.

10 Claims, 6 Drawing Sheets

(51) Int. Cl.
 H01L 23/498 (2006.01)
 H01L 23/31 (2006.01)

(56) References Cited

U.S. PATENT DOCUMENTS

| | | | | |
|---|---|---|---|---|
| 5,840,417 | A | * | 11/1998 | Bolger ................. H01L 21/563 |
| | | | | 257/E21.503 |
| 5,924,622 | A | | 7/1999 | Davis et al. |
| 6,196,444 | B1 | | 3/2001 | Davis et al. |
| 6,296,173 | B2 | | 10/2001 | Davis et al. |
| 6,333,206 | B1 | | 12/2001 | Ito et al. |
| 6,333,209 | B1 | | 12/2001 | Coico et al. |
| 6,399,178 | B1 | * | 6/2002 | Chung ................. H01L 21/563 |
| | | | | 174/255 |
| 2003/0220432 | A1 | * | 11/2003 | Miller ...................... C08K 3/04 |
| | | | | 524/439 |
| 2015/0368378 | A1 | * | 12/2015 | Chisholm ............. C07C 69/533 |
| | | | | 526/320 |

OTHER PUBLICATIONS

Socha, "Using Integrated Preforms for Solder Fortification", Indium Corporation (indium.com) online, Dec. 30, 2010, 1 page, URL: blogs.indium.com/blog/paul-socha/using-integrated-preforms-for-solder-fortification.

* cited by examiner

```
┌─────────────────────────────────────────────────────────────────────────┐
│ Apply a first preform sheet having an array of holes to a first component of the IC assembly  600 │
│  ┌───────────────────────────────────────────────────────────────────┐  │
│  │ Select a first preform sheet, the first preform sheet being sized to correspond to a first │  │
│  │              component of the IC assembly  602                    │  │
│  │   ╭─────────────────────────────────────────────────────────╮     │  │
│  │   │        Select a petroleum-based plastic sheet  612      │     │  │
│  │   ╰─────────────────────────────────────────────────────────╯     │  │
│  │   ╭─────────────────────────────────────────────────────────╮     │  │
│  │   │      Select a non-petroleum-based plastic sheet  614    │     │  │
│  │   ╰─────────────────────────────────────────────────────────╯     │  │
│  │   ╭─────────────────────────────────────────────────────────╮     │  │
│  │   │   Determine a melting point associated with the solder balls  616 │  │
│  │   ╰─────────────────────────────────────────────────────────╯     │  │
│  │                              ▼                                    │  │
│  │   ╭─────────────────────────────────────────────────────────╮     │  │
│  │   │ Determine a melting temperature profile associated with a reflow process to be │  │
│  │   │              applied to the IC assembly  618            │     │  │
│  │   ╰─────────────────────────────────────────────────────────╯     │  │
│  │                              ▼                                    │  │
│  │   ╭─────────────────────────────────────────────────────────╮     │  │
│  │   │ Select a preform material having a melting temperature greater that the melting │  │
│  │   │ point associated with the solder balls and less than the melting temperature profile │  │
│  │   │        associated with the reflow operation  620        │     │  │
│  │   ╰─────────────────────────────────────────────────────────╯     │  │
│  └───────────────────────────────────────────────────────────────────┘  │
│                                  ▼                                      │
│  ╭─────────────────────────────────────────────────────────────────╮    │
│  │ Place solder ball holes in the first preform sheet according to a location of one or more │  │
│  │      contact pads on the first component of the IC assembly  604 │    │
│  ╰─────────────────────────────────────────────────────────────────╯    │
│                                  ▼                                      │
│  ╭─────────────────────────────────────────────────────────────────╮    │
│  │ Apply the first preform sheet over the first component of the IC assembly such that the one │  │
│  │     or more contact pads are visible through the solder ball holes  606 │  │
│  ╰─────────────────────────────────────────────────────────────────╯    │
└─────────────────────────────────────────────────────────────────────────┘
                                   ▼
┌─────────────────────────────────────────────────────────────────────────┐
│              Apply a second preform sheet over the PCB  622             │
└─────────────────────────────────────────────────────────────────────────┘
                                   ▼
┌─────────────────────────────────────────────────────────────────────────┐
│         Attach solder balls to the contact pads through the solder ball holes  608         │
└─────────────────────────────────────────────────────────────────────────┘
                                   ▼
┌─────────────────────────────────────────────────────────────────────────┐
│         Attach the first component of the IC to a printed circuit board (PCB)  610         │
└─────────────────────────────────────────────────────────────────────────┘
```

FIG. 6

APPARATUS AND METHODS FOR CREATING ENVIRONMENTALLY PROTECTIVE COATING FOR INTEGRATED CIRCUIT ASSEMBLIES

BACKGROUND OF THE INVENTION

Field of the Invention

The field of the invention is data processing, or, more specifically, methods, apparatus, and products for creating environmentally protective coating for integrated circuit assemblies.

Description of Related Art

With the increasingly smaller components and lead/contact pitches on integrated circuits, there is a propensity for leakage generation in the presence of ionics, humidity, and other environmental factors. Current means of circuit/contact protection in integrated circuits, such as ball-grid arrays (BGAs), include injecting underfill material around the solder pins after an infrared reflow process. This procedure, however, has limitations associated with the capillary flow of the underfill. For example, the viscosity of the underfill material must be fine-tuned to the BGA pitch in order to ensure that each ball in encapsulated. Moreover, since the flow of the underfill to the center of the chip is driven solely by capillary action, it can take an inordinate amount of time to achieve full coverage. Consequently, an alternative method to achieve solder ball protection is desired.

SUMMARY OF THE INVENTION

Methods and products are described herein for creating an environmentally protected integrated circuit (IC) assembly that include selecting a first preform sheet, the first preform sheet being sized to correspond to a first component of the IC assembly and configured to create a conformal coating during a reflow operation; placing solder ball holes in the first preform sheet according to a location of one or more contact pads on the first component of the IC assembly; applying the first preform sheet over the first component of the IC assembly such that the one or more contact pads are visible through the solder ball holes; attaching solder balls to the contact pads through the solder ball holes; and attaching the first component of the IC to a printed circuit board (PCB).

The foregoing and other objects, features and advantages of the invention will be apparent from the following more particular descriptions of example embodiments of the invention as illustrated in the accompanying drawings wherein like reference numbers generally represent like parts of example embodiments of the invention.

BRIEF DESCRIPTION OF THE DRAWINGS

FIG. 6 depicts a flowchart illustrating an example of a method for creating an environmentally protective coating for integrated circuit assemblies in accordance with embodiments of the present invention.

DETAILED DESCRIPTION OF EXAMPLE EMBODIMENTS

Figure 1:
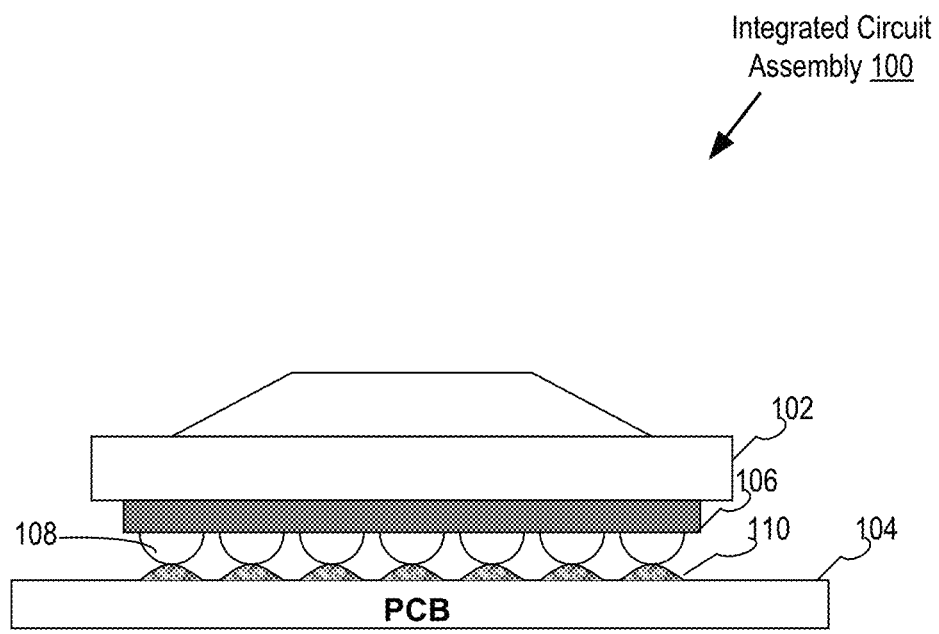
FIG. 1 illustrates an example diagram of an integrated circuit assembly that includes an environmental protective coating in accordance with embodiments of the present invention.

Example methods, apparatus, and products for creating an environmentally protective coating for integrated circuit assemblies in accordance with the present invention are described with reference to the accompanying drawings, beginning with FIG. 1. FIG. 1 sets forth an example diagram of an integrated circuit assembly (100) that includes an environmental protective coating created in accordance with embodiments of the present invention. As shown in FIG. 1, an integrated circuit (IC) (102) may be connected to a printed circuit board (PCB) (104) via a surface mount package such as a ball-grid array (BGA). A preform sheet (106) may be applied to the IC (102) prior to placing solder balls (108) on the IC (102). The solder balls (108) can connect to solder paste (110) on the PCB (104).

According to embodiments of the present invention, the preform sheet (106) may form a conformal coating over the solder connections following a reflow operation to protect the solder connections from environmental effects such as, for example, humidity, dust and ionics, and dirt. Such a reflow operation represents a process in which a solder paste (110) may be used to temporarily attach electrical components to contact pads. In a reflow operation, an IC assembly may be subjected to controlled heat, which melts solder to permanently connect surface mounted components such as the IC (102) to the PCB (104).

The preform sheet (106) may be a bio-based plastic sheet, other non-petroleum based plastic sheets, petroleum based plastic sheets, or other materials capable of forming a conformal coating. The preform sheet (106) may be selected to have a melting point (Tm(preform)) that is greater than the melting point of the solder balls (Tm(solder)) but less than the reflow temperature profile (T(reflow)) associated with the reflow process. That is, Tm (solder)<Tm (preform)<T (reflow).

One example of a preform sheet (106) according to embodiments of the present invention may be a bio-based plastic sheet made from Polyamide 610, which is derived from castor oil. In another embodiment, the preform sheet (106) may be a bio-based plastic sheet made from nylon 6 and nylon 6,6, also referred to as the polyamides PA 6 and PA 6,6, intermediates derived from the fermentation of various microorganisms.

Figure 2:
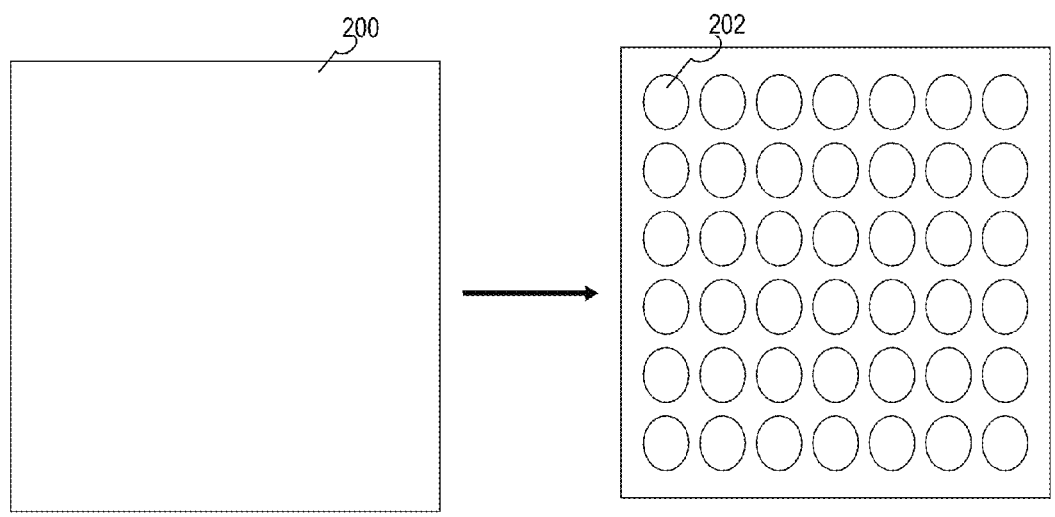
FIG. 2 shows an example of a preform sheet that may be useful in creating an environmentally protective coating for integrated circuit assemblies in accordance with embodiments of the present invention.

For further explanation, FIG. 2 shows an example of a preform sheet (200) that may be useful in creating an environmentally protective coating for integrated circuit assemblies in accordance with the present invention. The preform sheet (200) may be sized to conform to the component to which it will be attached (e.g., the BGA or the like). The preform sheet (200) may have holes (202) punched therein for placing solder balls.

Figure 3:
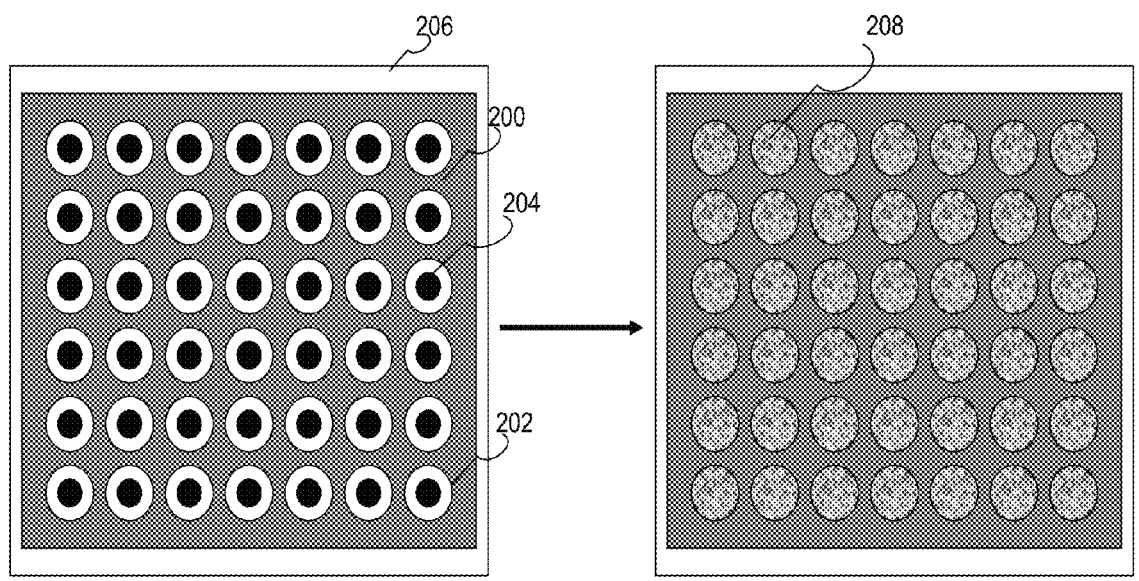
FIG. 3 shows an example of a preform sheet and solder balls placed on the bottom of an integrated circuit in accordance with embodiments of the present invention.

As further shown in FIG. 3, the placement of the holes (202) can correspond to the location of contact pads (204) on an IC (206). The preform sheet (200) may be applied to the substrate/underside of the IC (206) and registers to the contact pads (204). As further shown in FIG. 3, the solder balls (208) may be placed on the IC (206) via the solder ball holes (202).

Figure 4:
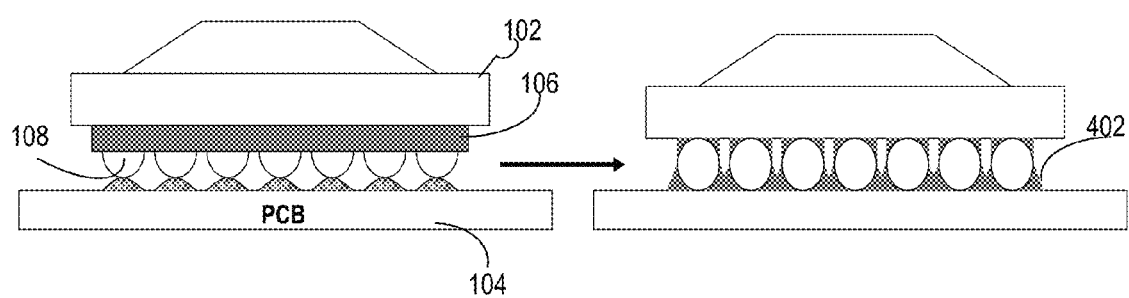
FIG. 4 shows an example of a reflow process in accordance with embodiments of the present invention.

For further illustration, FIG. 4 illustrates the effects of performing a reflow process on an integrated circuit assembly in accordance with embodiments of the present invention. As described above with respect to FIG. 1, an IC (102) may be connected to a PCB (104) using a surface mount package such as a BGA. A preform sheet (106) may be applied to the IC (102) prior to placing solder balls (108) on the IC (102). The solder balls (108) can connect to solder paste (110) on the PCB (104). During the reflow process, the preform sheet (106) may melt to form a conformal layer (402) that coats the solder connections, thereby protecting sensitive circuitry from environmental effects such has, for example, humidity, dust and ionics, and gaseous contaminations.

Figure 5:
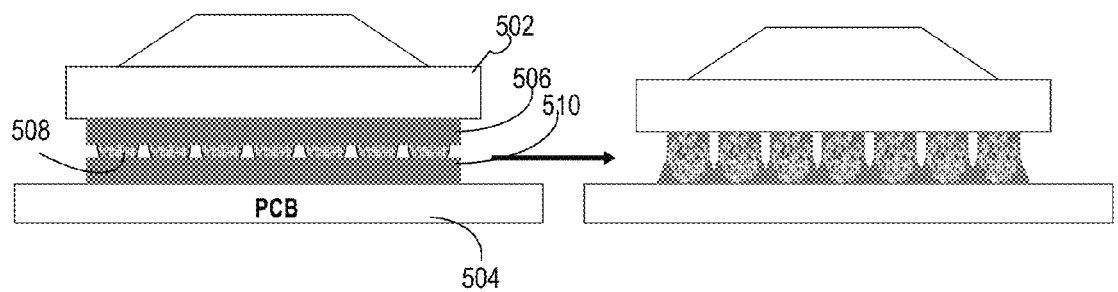
FIG. 5 shows another example of a reflow process in accordance with embodiments of the present invention.

For further explanation, FIG. 5 illustrates the effects of performing a reflow process on an integrated circuit assembly in accordance with embodiments of the present invention. Similar to the IC shown in FIGS. 1 and 4, the IC (502) may be connected to the PCB (504) using a surface mount package such as a BGA. A first preform sheet (506) may be applied to the IC (502) prior to placing solder balls (508) on the IC (502). In the example shown in FIG. 5, a second preform sheet (510) may be placed on the PCB (504) prior to reflow to provide additional protection to the circuit components. During a reflow process, both preform sheets (506, 510) may melt to form a conformal layer that coats the solder connections, thereby protecting sensitive circuitry from environmental effects such as, for example, humidity, dust and ionics, and gaseous contaminations.

FIG. 6 depicts a flowchart illustrating an example of a method for creating an environmentally protective coating for IC assemblies in accordance with the present invention. The example method depicted in FIG. 6 includes applying (600) a first preform sheet having an array of holes to a first component of the IC assembly. In the example depicted in FIG. 6, the holes within the first preform sheet are aligned to expose one or more of an array of contact pads on the first component. In addition, the first preform sheet is configured to create a conformal coating during a reflow operation.

In the example method depicted in FIG. 6, applying (600) a first preform sheet having an array of holes to a first component of the IC assembly can include selecting (602) a first preform sheet. The first preform sheet may be sized to correspond to a first component of the IC assembly and configured to create a conformal coating during a reflow operation. For example, the first preform sheet may be configured as shown in FIGS. 1-5 above. In the example method depicted in FIG. 6, selecting (602) a first preform sheet can include selecting (612) a petroleum-based plastic sheet or, alternatively, selecting (614) a non-petroleum-based plastic sheet.

In the example method depicted in FIG. 6, selecting (602) a first preform sheet can alternatively include determining (616) a melting point associated with the solder balls, determining (618) a melting temperature profile associated with a reflow process to be applied to the IC assembly, and selecting (620) a preform material having a melting temperature that is greater that the melting point associated with the solder balls and less than the melting temperature profile associated with the reflow operation. Because the preform material has a melting temperature that is greater that the melting point associated with the solder balls and less than the melting temperature profile associated with the reflow operation, the solder balls may melt prior to the preform sheet melting, thereby ensuring a reliable solder joint.

In the example method depicted in FIG. 6, applying (600) a first preform sheet having an array of holes to a first component of the IC assembly can also include placing (604) solder ball holes in the first preform sheet according to a location of one or more contact pads on the first component of the IC assembly. For example, the solder balls may be manually or mechanically placed (604) in accordance to the placement of contact pads on the substrate of an IC.

In the example method depicted in FIG. 6, applying (600) a first preform sheet having an array of holes to a first component of the IC assembly can also include applying (606) the first preform sheet over the first component of the IC assembly such that the one or more contact pads are visible through the solder ball holes. The example method depicted in FIG. 6 also includes attaching (608) solder balls to the contact pads through the solder ball holes and attaching (610) the first component of the IC to a PCB. The example method depicted in FIG. 6 also includes applying (622) a second preform sheet over the PCB prior to the reflow operation to provide for additional circuit protection.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An integrated circuit assembly comprising:
   an integrated circuit having a plurality of contact pads formed therein;
   a first preform sheet having holes formed therein corresponding to the location of the plurality of contact pads, the first preform being applied to a substrate side of the integrated circuit and configured to create a conformal coating during a reflow operation;
   a printed circuit board;
   a plurality of solder balls placed over the plurality of contact pads, the solder balls forming a connection between the integrated circuit and the printed circuit board during the reflow operation,
   wherein the first preform sheet melts during the reflow operation to form the conformal coating; and
   a second preform sheet being applied over the printed circuit board.

2. The integrated circuit assembly of claim 1, wherein the first preform sheet comprises a petroleum-based plastic sheet.

3. The integrated circuit assembly of claim 1, wherein the first preform sheet comprises a non-petroleum-based plastic sheet.

4. The integrated circuit assembly of claim 1, wherein the first preform sheet comprises a bio-based, non-petroleum plastic sheet.

5. The integrated circuit assembly of claim 1 wherein the first preform layer has a melting point that is greater that a melting point associated with the solder balls and less than a melting temperature profile associated with the reflow operation.

6. A printed circuit board ('PCB') comprising:
   a substrate comprising a plurality of ball grid array (BGA) holes, each BGA hole coupled to a solder ball of an integrated circuit (IC) during a reflow operation; and
   a preform sheet having holes formed therein corresponding to the location of the plurality of BGA holes, wherein the preform sheet melts during the reflow operation to form a conformal coating of a joint between the IC and the PCB,
   wherein the preform sheet has a melting point that is greater that a melting point associated with the solder balls and less than a melting temperature profile associated with the reflow operation.

7. The PCB of claim 6, wherein the preform sheet comprises a petroleum-based plastic sheet.

8. The PCB of claim 6, wherein the preform sheet comprises a non-petroleum-based plastic sheet.

9. The PCB of claim 6, wherein the preform sheet comprises a bio-based, non-petroleum plastic sheet.

10. The PCB of claim 6 wherein preform sheet has a melting point that is greater that a melting point associated with the solder balls and less than a melting temperature profile associated with the reflow operation.

* * * * *